US012728997B2

(12) United States Patent
Epskamp

(10) Patent No.: US 12,728,997 B2
(45) Date of Patent: Sep. 8, 2026

(54) GALLEY INSERT CONTROL MODULE

(71) Applicant: B/E Aerospace, Inc., Winston Salem, NC (US)

(72) Inventor: Job Epskamp, Utrecht (NL)

(73) Assignee: B/E AEROSPACE, INC., Winston Salem, NC (US)

( * ) Notice: Subject to any disclaimer, the term of this patent is extended or adjusted under 35 U.S.C. 154(b) by 204 days.

(21) Appl. No.: 18/505,503

(22) Filed: Nov. 9, 2023

(65) Prior Publication Data

US 2024/0158084 A1 May 16, 2024

(30) Foreign Application Priority Data

Nov. 11, 2022 (EP) .................................... 22206966

(51) Int. Cl.

*B64D 11/04* (2006.01)
*C22C 23/00* (2006.01)
*H01Q 1/28* (2006.01)
*H05K 5/00* (2006.01)

(52) U.S. Cl.

CPC .............. *B64D 11/04* (2013.01); *C22C 23/00* (2013.01); *H01Q 1/28* (2013.01); *H05K 5/0017* (2013.01)

(58) Field of Classification Search

CPC ................ B64D 11/04; B64D 11/0007; B64D 2013/0674; B64D 2011/0046; B64D 13/08; B64D 2013/0629; C22C 23/00; H05K 5/0017; H05K 5/04; H05K 7/20681; H05K 9/00

See application file for complete search history.

(56) References Cited

U.S. PATENT DOCUMENTS

| | | | | |
|---|---|---|---|---|
| 8,273,986 | B2 | 9/2012 | Liu et al. | |
| 8,435,444 | B2 | 5/2013 | Stolfig | |
| 10,798,549 | B1 | 10/2020 | Reed et al. | |
| 2011/0048169 | A1* | 3/2011 | Stolfig | B23K 35/284 420/405 |
| 2021/0291986 | A1* | 9/2021 | Mulders | F24C 15/16 |
| 2022/0082299 | A1* | 3/2022 | Ciesielski | A23L 5/00 |

FOREIGN PATENT DOCUMENTS

| | | | | |
|---|---|---|---|---|
| CA | 2745861 A1 | | 1/2013 | |
| WO | WO-2020068045 A1 | * | 4/2020 | C09D 183/02 |
| WO | 2021177977 A1 | | 9/2021 | |

OTHER PUBLICATIONS

European Search Report for Application No. 22206966.8, mailed Mar. 31, 2023, 7 pages.

* cited by examiner

*Primary Examiner* — Mandeep S Buttar
(74) *Attorney, Agent, or Firm* — CANTOR COLBURN LLP

(57) ABSTRACT

A galley insert control module for an aircraft galley insert includes an electronics module for controlling an aircraft galley appliance and a magnesium alloy housing for the electronics module. The magnesium alloy housing may be arranged around the electronics module to form part of a physical barrier around the electronics module without physically supporting the electronics module. This can form a physical barrier which provides physical protection and protection from dust and moisture for the electronics module. In one example, the magnesium alloy housing physically supports the electronics module. This can provide structural integrity to the electronics module.

15 Claims, 2 Drawing Sheets

GALLEY INSERT CONTROL MODULE

CROSS REFERENCE TO RELATED APPLICATIONS

This application claims priority to European Patent Application No. 22206966.8 filed Nov. 11, 2022, the entire contents of which is incorporated herein by reference.

TECHNICAL FIELD

This disclosure relates to control modules for aircraft galley inserts and electronics module housings for these control modules.

BACKGROUND

Aluminium and aluminium alloys are well established light-weight materials that are widely used in the aerospace industry. Use of aluminium and aluminium alloys has been the status quo in this industry for decades.

Magnesium alloys are lighter than aluminium alloys and have a much lower carbon footprint, making them a much more sustainable choice of material with comparable material properties. However, magnesium alloys have not been widely exploited in the aerospace industry; partly due to challenges with compliance to aerospace standards, most notably with the flammability standards.

SUMMARY

When viewed from a first aspect, the present disclosure provides an aircraft galley insert control module comprising: an electronics module for controlling an aircraft galley appliance; and a magnesium alloy housing for the electronics module.

The magnesium alloy housing may be arranged around the electronics module to form part of a physical barrier around the electronics module without physically supporting the electronics module. This can form a physical barrier which provides physical protection and protection from dust and moisture for the electronics module. In one example, the magnesium alloy housing physically supports the electronics module. This can provide structural integrity to the electronics module.

The electronics module may be arranged to substantially not be in thermal contact with the magnesium alloy housing. This can provide thermal insulation between the electronics module and the magnesium alloy housing. In one example, the electronics module is supported in thermal contact with the magnesium alloy housing. This can allow the magnesium alloy housing to act as a heat sink for the enclosed electronics.

The magnesium alloy housing may be designed to be a very simple rectangular shape. This can allow for ease of manufacture of the magnesium alloy housing. In one example, the magnesium alloy housing defines an outer groove arranged to provide airflow over the housing. This can provide the ability of the magnesium alloy housing to act as an effective surface for heat transfer away from the galley insert control module.

The electronics module may be arranged to substantially not be connected with the magnesium alloy housing. This can provide electrical insulation between the electronics module and the magnesium alloy housing. In one example, the electronics module is connected with the magnesium alloy housing to form a grounding path.

The electronics module may be arranged to sit freely within the magnesium alloy housing. This can eliminate the need for any screws or alternative connecting fixings. In one example, the electronics module is fixedly connected to the magnesium alloy housing. This can provide robust structural support to the electronics module.

The magnesium alloy housing may allow the position of the electronics module within the housing to be freely determined during assembly. This can account for various other factors such as installation or configuration of the galley insert control module. In one example, the magnesium alloy housing comprises one or more internal ribs arranged to locate the electronics module.

The magnesium alloy housing may have any design to provide it with the requisite structural integrity. According to one example, the magnesium alloy housing comprises one or more ribs to provide structural integrity. This can minimise the weight of the housing.

A trade-off exists between thicker magnesium alloy housings weighing more, but thinner magnesium alloy housings being less robust. According to one example, the thickness of the magnesium alloy housing is within the range 0.3-2.0 mm. This can provide a sufficiently robust housing that is also light-weight.

The magnesium alloy housing may be made of several pieces connected together. This may enable simpler individual pieces to fabricated. According to one example, the magnesium alloy housing is a one-piece housing. This can remove the need for connections between several pieces.

According to one example, the one-piece magnesium alloy housing surrounds the electronics module on at least two sides, preferably on at least three sides, further preferably on five sides.

According to one example, the one-piece housing comprises a supporting surface for the electronics module, one or more side surfaces and one or more bends connecting the supporting surface to the one or more side surfaces.

According to one example, the magnesium alloy housing is manufactured by the process of die-casting and/or CNC machining the magnesium alloy.

According to one example, the galley insert control module further comprises a cover for the electronics module.

According to one example, the cover for the electronics module is fixedly connected to the magnesium alloy housing.

According to one example, the magnesium alloy housing and cover are connected together to form an enclosure for the electronics module. This can form a physical barrier which provides physical protection and protection from dust and moisture for the electronics module.

The cover may be made from plastic, ceramic composite, or any suitable material. According to one example, the cover is metallic. This can allow the cover to form part of a Faraday cage around the electronics module.

The cover may be made from any appropriate metal. According to one example, the cover is made from aluminium or an aluminium alloy. Aluminium and aluminium alloys are lightweight materials that enable weight reduction relative to many alternative metals or metal alloys.

According to one example, the cover is made from sheet material.

A trade-off exists between thicker covers weighing more, but thinner covers being less robust. According to one example, the thickness of the cover is within the range 0.3-1.0 mm or 0.3-2.0 mm. This can provide a sufficiently robust cover that is also light-weight.

In various examples, the cover is thinner than the magnesium alloy housing.

According to one example, the electronics module comprises a printed circuit board and a microcontroller for an aircraft galley appliance.

According to one example, the galley insert control module is part of an aircraft galley insert, which further comprises an aircraft galley appliance operably connected to the electronics module.

According to one example, the aircraft galley appliance is any of a water heater, a hot beverage maker, a convection oven, a steam oven, a beverage chiller, a refrigerator, a freezer, a microwave oven, a bun warmer, or a trash compactor.

According to one example, the magnesium alloy has one of the following compositions:

- 2.5-3.5% Aluminium, 0.7-1.3% Zinc, 0.20-1.0% Manganese, Balance Magnesium; or
- 0.2-0.5% Zinc, 2.6-3.1% Neodymium, 1.0-1.7% Gadolinium, 0.4% min. Zirconium, Balance Magnesium; or
- 3.7-4.3% Yttrium, 2.3-3.5% Rare earths, 0.2% min. Zirconium, Balance Magnesium; or
- 7.8-9.2% Aluminium, 0.2-0.8% Zinc, 0.12-0.5% Manganese, Balance Magnesium; or
- 3.5-5% Zinc, 0.8-1.7% Rare Earths, 0.4-1% Zirconium, Balance Magnesium; or
- 3.7-4.3% Yttrium, 2.4-4.4% Rare Earths, 0.4% min. Zirconium, Balance Magnesium.

According to one example, the magnesium alloy complies with the aerospace standards 14CFR/JAR§ 25.853 as set out in the Federal Aviation Regulations, or equivalent.

According to one example, the magnesium alloy housing is designed to comply with the aerospace testing requirements as outlined by the Radio Technical Commission for Aeronautics in the RTCA DO-160 section 7 & 8, or equivalent.

When viewed from a second aspect, the present disclosure provides a method of manufacturing a magnesium alloy housing for an aircraft galley insert control module, for example for an aircraft galley insert control module comprising an electronics module for controlling an aircraft galley appliance. The disclosed method may relate to manufacturing a magnesium alloy housing for an aircraft galley insert control module according to any of the examples described above.

According to some examples, the method may further comprise installing an electronics module in the magnesium alloy housing. For example, the method may further comprise fixing the electronics module to the magnesium alloy housing.

According to some examples, the method may comprise die-casting and/or CNC machining the magnesium alloy housing.

According to one example, the method comprises manufacturing the magnesium alloy housing to define an outer groove arranged to provide airflow over the housing.

According to one example, the method comprises manufacturing the magnesium alloy housing with ribs.

According to one example, the method comprises manufacturing a magnesium alloy housing with a thickness within the range 0.3-2.0 mm.

According to one example, the method comprises manufacturing the magnesium alloy housing as a one-piece housing.

BRIEF DESCRIPTION OF DRAWINGS

One or more non-limiting examples will now be described, by way of example only, and with reference to the accompanying figures in which.

DETAILED DESCRIPTION

Figure 1:
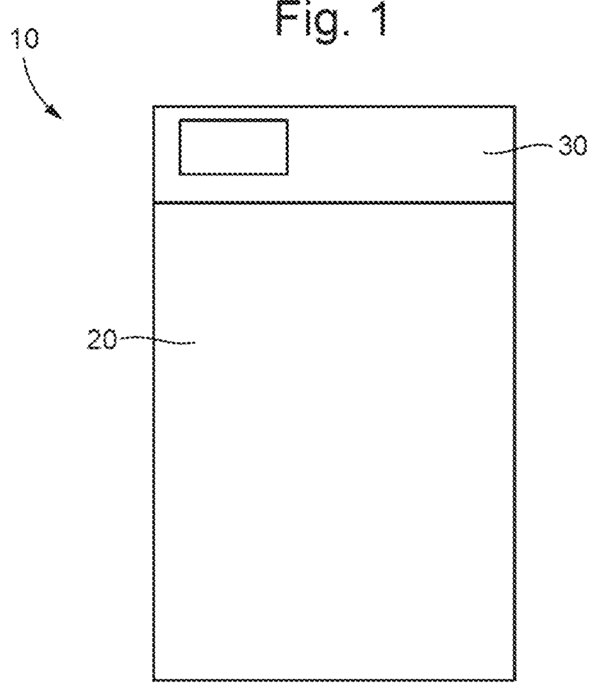
FIG. 1 shows a front view of a galley insert.

Referring to FIG. 1, a galley insert (10) comprises a galley insert appliance (20), and a galley insert control module (30) for the appliance (20).

Figure 2A:
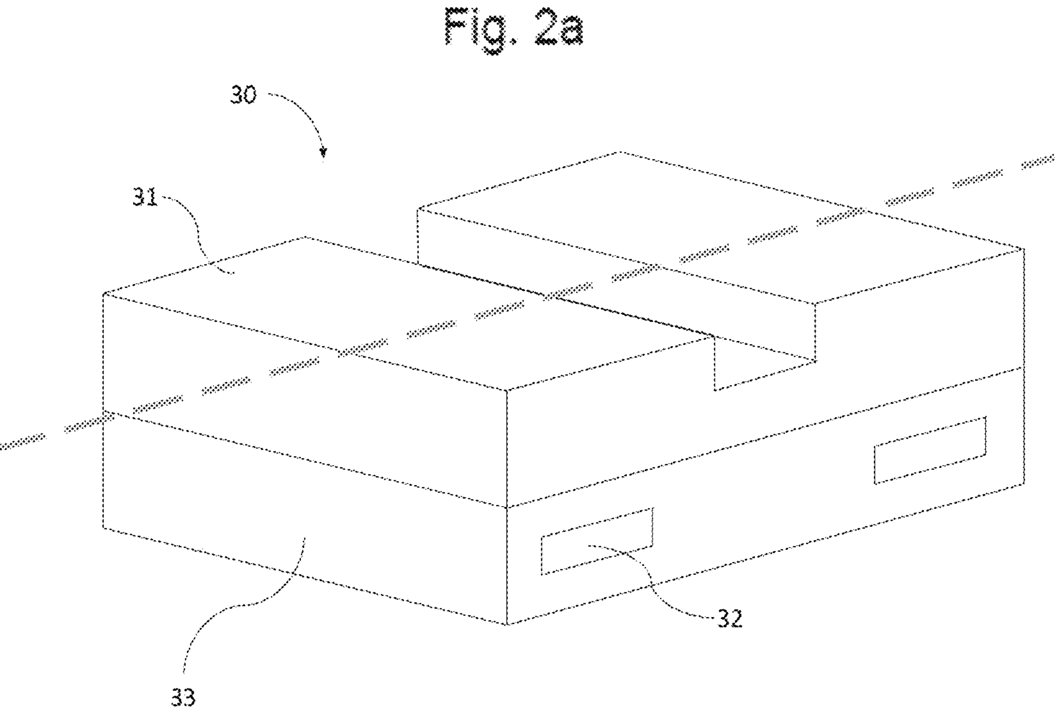
FIG. 2*a* shows a galley insert control module for a galley insert.
Figure 2B:
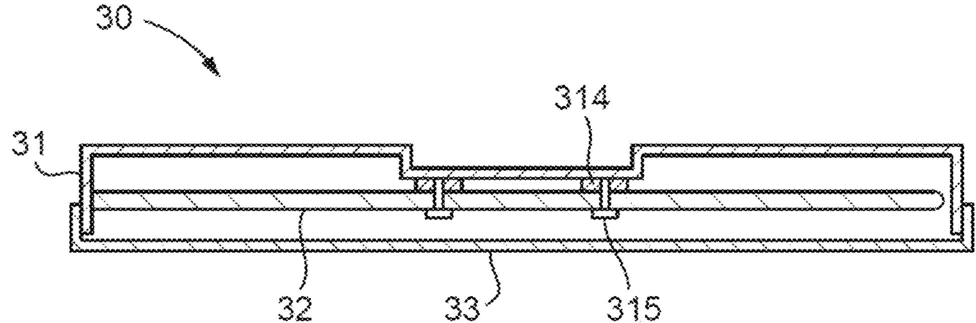
FIG. 2*b* shows a cross-sectional view of a galley insert control module for a galley insert through the dashed line in FIG. 2*a*.

Referring to FIGS. 2*a* and 2*b*, a galley insert control module (30) comprises a magnesium alloy housing (31), an electronics module (32) and a cover for the electronics module (33). The magnesium alloy housing (31) comprises raised bosses (314) with threaded screw holes for securing the electronics module (32) to the magnesium alloy housing (31).

Figure 3:
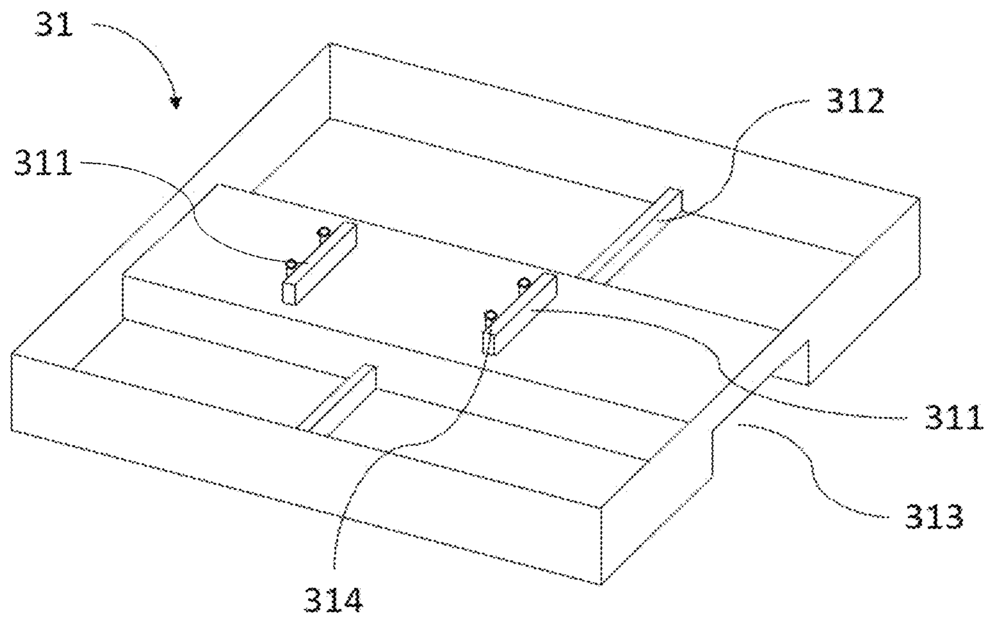
FIG. 3 shows a magnesium alloy housing for galley insert control module for a galley insert.

Referring to FIG. 3, the magnesium alloy housing (31) comprises locating ribs (311) for locating the electronics module (32) within the magnesium alloy housing (31), ribs (312) for providing structural integrity to the magnesium alloy housing (31), and an outer groove arranged to provide airflow over the housing (313).

The galley insert appliance (20) may be any appliance for an aircraft galley, such as a water heater, a hot beverage maker, a convection oven, a steam oven, a beverage chiller, a refrigerator, a freezer, a microwave oven, a bun warmer, or a trash compactor. One skilled in the art will understand that while these examples are given, other appliances may equally be suitable for use in an aircraft galley. In this example, the aircraft galley appliance is a steam oven.

In this example, the galley insert control module (30) is fixedly connected to the galley appliance (20).

In this example, the galley insert control module (30) is used to control the galley appliance (20) and is operably connected to the galley appliance (20) directly using a wired connection. However, one skilled in the art would appreciate that the control module (30) may be operably connected to the control module indirectly, via some intermediary controller or similar, or wirelessly.

In this example, the electronics module (32) for the control module (30) is housed in a magnesium alloy housing (31) which provides it with structural support. FIG. 2*b* shows the electronics module (32) fixedly connected to the magnesium alloy housing (31) by use of screws (315) that are tightened into raised bosses (314), with threaded screw holes, on the internal surface of the magnesium alloy housing (31).

FIG. 2*b* also shows a cover (33) connected to the magnesium alloy housing (31) which together with the housing forms an enclosure around the electronics module. While a cover (33) is shown in this embodiment, one skilled in the art will appreciate that it may not be required, as the module may be connected, for example, directly to the galley appliance or to any suitable intermediary between the galley appliance and the electronics housing.

In this example, the magnesium alloy housing comprises ribs (311, 312) which have multiple purposes. Ribs (311) are arranged to enable location of the electronics module (32) within the housing (31). Ribs (312) are further arranged to provide structural integrity to the magnesium alloy housing (31). One skilled in the art will appreciate that it is possible that the ribs (312) to provide structural support and the ribs (311) arranged to locate the electronics module (32) may be the same ribs and are not required to be distinct from one another.

In this example, the magnesium alloy housing (31) is arranged to be in thermal contact with the electronics module (32) such that it acts as a heat sink to transfer heat away from the electronics module.

In this example, the magnesium alloy housing (31) is designed with a groove (313) arranged to allow air to flow over the housing in such a way that it acts to transfer heat away from the housing.

In this example, the magnesium alloy housing (31) is designed to be light-weight and in this example, the thickness of the magnesium alloy housing (31) has a thickness in the range 0.3-2.0 mm.

In this example, the magnesium alloy housing (31) is a one-piece housing and is a die-casted housing. In this example, the die-casted housing (31) is then further CNC machined to add any features to the housing that can't be die-casted if this is required.

In this example, the magnesium alloy housing (31) covers the electronics module (32) on 5 sides and is provided with a supporting surface, the top, internal, surface of the housing (31) in FIG. 3 to which the module is connected, which provides support to the module (32). The housing (31) further comprises side surfaces which together with the cover (33) complete the enclosure of the electronics module (32).

In this example, the electronics cover (33) is a sheet metal aluminium alloy cover which has been processed into an appropriate shape to complete an enclosure around the electronics module (32) as shown in FIGS. 2*a* and 2*b*. The magnesium alloy housing (31) is in electrical contact with the electronics module (32) to provide a grounding path and the cover (33) forms a Farady cage around the electronics module (32) with the magnesium alloy housing (31) to minimise electromagnetic interference to or from the device.

In this example, the aluminium alloy sheet metal cover (32) is thinner than the magnesium alloy housing (31), e.g. in the range of 0.3-1.5 mm.

In this example, the electronics module (32) comprises a PCB and a microcontroller arranged to control the galley appliance.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims

The invention claimed is:

1. An aircraft galley insert control module comprising:

an electronics module for controlling an aircraft galley appliance; and a magnesium alloy housing for the electronics module, wherein the magnesium alloy has the following composition:

3.7-4.3% yttrium;

2.4-4.4% rare earths;

0.4% min. zirconium; and balance magnesium.

2. An aircraft galley insert control module according to claim 1, wherein the electronics module is supported in thermal contact with the magnesium alloy housing.

3. An aircraft galley insert control module according to claim 1, wherein the magnesium alloy housing defines an outer groove arranged to provide air flow over the housing.

4. An aircraft galley insert control module according to claim 1, wherein the electronics module is fixedly connected to the magnesium alloy housing.

5. An aircraft galley insert control module according to claim 1, wherein the magnesium alloy housing comprises one or more internal ribs arranged to locate the electronics module.

6. An aircraft galley insert control module according to claim 1, wherein the thickness of the magnesium alloy housing is in the range 0.3-2.0 mm.

7. An aircraft galley insert control module according to claim 1, wherein the magnesium alloy housing is a one-piece housing.

8. An aircraft galley insert control module according to claim 7, wherein the one-piece housing comprises a supporting surface for the electronics module, one or more side surfaces, and one or more bends connecting the supporting surface to the one or more side surfaces.

9. An aircraft galley insert control module according to claim 1, wherein the magnesium alloy housing is manufactured by the process of die-casting and/or CNC machining the magnesium alloy.

10. An aircraft galley insert control module according to claim 1, further comprising:

a cover for the electronics module, wherein the magnesium alloy housing and cover are connected together to form an enclosure for the electronics module.

11. An aircraft galley insert control module according to claim 10, wherein the cover is made from sheet material.

12. An aircraft galley insert control module according to claim 10, wherein the cover is thinner than the magnesium alloy housing.

13. An aircraft galley insert control module according to claim 1, wherein the electronics module comprises a printed circuit board and a microcontroller for an aircraft galley appliance.

14. An aircraft galley insert comprising:

an aircraft galley insert control module according to claim 1; and an aircraft galley appliance operably connected to the aircraft galley insert control module.

15. A method of manufacturing a magnesium alloy housing for an aircraft galley insert control module as recited in claim 1, the method comprising:

forming magnesium alloy housing such that it includes bosses with threaded screw holes for securing the electronics module to the magnesium alloy housing.

* * * * *